United States Patent
Egerton et al.

(10) Patent No.: US 9,677,946 B1
(45) Date of Patent: Jun. 13, 2017

(54) INFRARED RADIATION DETECTORS USING CARBON NANOTUBES-SILICON VANADIUM OXIDE AND OR AMORPHOUS SILICON NANOPARTICLES-CNT NANOCOMPOSITES AND METHODS OF CONSTRUCTING THE SAME

(71) Applicant: Magnolia Optical Technologies, Inc., Woburn, MA (US)

(72) Inventors: Elwood J. Egerton, Hot Springs, SD (US); Ashok K. Sood, Brookline, MA (US)

(73) Assignee: Magnolia Optical Technologies, Inc., Woburn, MA (US)

( * ) Notice: Subject to any disclaimer, the term of this patent is extended or adjusted under 35 U.S.C. 154(b) by 0 days.

(21) Appl. No.: 14/757,711

(22) Filed: Dec. 22, 2015

Related U.S. Application Data (60) Provisional application No. 62/095,744, filed on Dec. 22, 2014.

(51) Int. Cl.
| | | |
|---|---|---|
| G01J 5/02 | (2006.01) | |
| G01J 5/24 | (2006.01) | |
| H01L 31/09 | (2006.01) | |
| H01L 31/028 | (2006.01) | |
| G01J 5/08 | (2006.01) | |

(52) U.S. Cl.
CPC ............... *G01J 5/24* (2013.01); *G01J 5/0809* (2013.01); *H01L 31/028* (2013.01); *H01L 31/095* (2013.01)

(58) Field of Classification Search
CPC ....... G01G 5/24; G01J 5/0809; H01L 31/028; H01L 31/095
See application file for complete search history.

(56) References Cited

U.S. PATENT DOCUMENTS

| | | | |
|---|---|---|---|
| 6,400,088 B1 | 6/2002 | Livingston et al. | |
| 8,110,883 B2 | 2/2012 | Ward et al. | |
| 8,455,828 B1 * | 6/2013 | Egerton | G01J 1/46 250/339.01 |
| 8,916,825 B1 * | 12/2014 | Egerton | G01J 5/046 250/338.4 |
| 9,196,766 B1 * | 11/2015 | Egerton | G01J 5/20 |
| 2011/0315981 A1 * | 12/2011 | Xu | G01J 5/02 257/43 |

* cited by examiner

*Primary Examiner* — Marcus Taningco
(74) *Attorney, Agent, or Firm* — Loginov & Associates; William A. Loginov (57) ABSTRACT

The present disclosure relates to microbolometer structures having top layers of amorphous silicon or vanadium oxide. In some examples, combinations of carbon nanotubes, nanoparticles, and/or thin films can be deposited atop the existing top layer of amorphous silicon or top layer of vanadium oxide of a microbolometer structure. Such configurations can increase the sensitivity of the microbolometers to less than 4 mK, less than 2 mK, and in some examples less than 1 mK.

5 Claims, 7 Drawing Sheets

α-Si MICROBOLOMETER PROCESS FLOW

1 REFLECTOR LAYER

Fig. 2A

2 POLYMIDE

Fig. 2B

3 Si3N4 AND SiO2

Fig. 2C

4 METAL CONTACT AND ALPHA SILICON LAYER

Fig. 2D

5 SiO2, GOLD BLACK AND Si3N4

Fig. 2E

6 SACRIFICIAL LAYER PATTERNING & RELEASE

Fig. 2F

NOTE 1

SiO2 102 | Si3N4 103 | Au 105 | GOLD BLACK 108 | α-SILICON 109 | Si 101 | POLYIMIDE 104

NOTE 1: ALL SLANTED HATCH PATTERNS ARE 102 (SiO2).

VOx MICROBOLOMETER PROCESS FLOW

1 REFLECTOR LAYER

Fig. 3A

2 POLYMIDE

Fig. 3B

3 Si3N4 AND SiO2

Fig. 3C

4 METAL CONTACT AND ALPHA SILICON LAYER

Fig. 3D

5 SiO2, GOLD BLACK AND Si3N4

Fig. 3E

6 SACRIFICIAL LAYER PATTERNING & RELEASE

Fig. 3F

NOTE 1

SiO2 102 | Si3N4 103 | Au 105 | GOLD BLACK 108 | VOx 109 | Si 101 | POLYIMIDE 104

NOTE 1: ALL SLANTED HATCH PATTERNS ARE 102 (SiO2).

INFRARED RADIATION DETECTORS USING CARBON NANOTUBES-SILICON VANADIUM OXIDE AND OR AMORPHOUS SILICON NANOPARTICLES-CNT NANOCOMPOSITES AND METHODS OF CONSTRUCTING THE SAME

RELATED APPLICATIONS

This application claims the benefit of U.S. Provisional Application Ser. No. 62/095,744, filed Dec. 22, 2014, entitled INFRARED RADIATION DETECTORS USING CARBON NANOTUBES-SILICON VANADIUM OXIDE AND OR AMORPHOUS SILICON NANOPARTICLES-CNT NANOCOMPOSITES AND METHODS OF CONSTRUCTING THE SAME, the entire disclosure of which is herein incorporated by reference.

FIELD OF THE INVENTION

The present invention relates generally to carbon nanotube nanocomposites and amorphous silicon or vanadium oxide nanoparticles.

BACKGROUND OF THE INVENTION

Photodetectors are an integral part of optical circuits and components (for example emitters, modulators, repeaters, waveguides or fibers, reflectors, resonators, detectors, IR Focal plane arrays, etc.) and are used for the sensing of electromagnetic radiation. There are several approaches to these devices. Photoconducting materials, typically semiconductors, have electrical properties that vary when exposed to electromagnetic radiation (i.e. light). One type of photoconductivity arises from the generation of mobile carriers (electrons or holes) during absorption of photons. For semiconducting materials, the absorption of a specific wavelength of light, hence photon energy, is directly proportional to the band gap of the material ($Eg=hn=hc/1$, where Eg is the materials band gap, h is Plank's constant ($4.136 \times 10-15$ eVs), c is the speed of light in a vacuum ($2.998 \times 1010$ cm/s) and l is the wavelength of the radiation). If the band gap energy is measured in eV (electron Volts) and the wavelength in micrometers, the above equation reduces to $Eg=1.24/1$. A photodiode (i.e. p-n diode, p-i-n photodiode, avalanche photodiode, etc.) is the most commonly employed type of photoconductor.

Light detection is ideally suited for direct band gap semiconductors such as Ge, GaAs, etc.; however, indirect band gap semiconductors (where an additional phonon energy is required to excite an electron from the valence band to the conduction band), such as Silicon, are also used as photodetectors. Probably the most widely known type of photodetctor is the solar cell, which uses a simple p-n diode or Schottky barrier to detect impinging photons. Besides silicon, most photodetectors do not integrate with current microelectronics technology, usually detect only a specific wavelength (i.e. 1.1 mm for Si, 0.87 mm for GaAs, 0.414 mm for a-SiC and 1.89 mm for Ge), and require multiple detectors to detect a broad band of wavelengths (hence photon energy).

There are other types of photodetectors that do not rely on the generation of current through the excitation of electrons (or holes). One such type of detector is the bolometer. Bolometers operate by absorbing radiation, which in turn raises the temperature of the material and hence alters the resistance of the material. Bolometers can be constructed from either metallic, metallic-oxides or semiconducting materials such as vanadium oxide, amorphous silicon. Since bolometers detect a broad range of radiation above a few microns, bolometers are typically thermally stabilized to reduce the possibility of detection of blackbody radiation that is emitted from the detector material, which leads to a high background noise. IR microbolometer detectors and arrays don't require cooling to cryogenic temperatures unlike the other detector technologies discussed. Another type of non-photo-generated detector is the pyroelectric detector. Pyroelectric detectors operate by sensing induced surface charges that are related to changes in the internal dipole moment generated from temperature shifts in the material.

It is possible for IR and visible light to be detected from individual single-walled graphene (SWNTs). Graphene possess discrete absorption peaks that correspond to specific photon energies. For useful background material, refer to U.S. Pat. No. 6,400,088. As described, the absorption peaks of the graphene correlate directly to the diameter of the carbon nanotube.

Thermal infrared detectors, such as microbolometers, are a part of IR systems used to image heat emitted from natural phenomena. The current state of the art microbolometer utilizes vanadium oxide as the element which changes impedance for incoming IR radiation. Despite the improvements to the use and costs of IR focal plane arrays (IRFPAs), which are most sensitive in the LWIR (8-12 microns) and MWIR (3-5 microns), there seems to be a limit to sensitivity at 20 mk NEDT. This performance is restricted by 1/f noise and the basic physical properties of the vanadium oxide (VOx) film. In addition, as the needs for increased sensitivity and smaller pixel size below 25 micron, silicon technology has run up against a sensitivity wall due to the scaling of 1/f noise as pixel size are reduced and the absolute noise floor is realized the basic properties of the silicon needs to be optimized for low noise operation.

One solution of the prior art is to use of carbon nanotubes to reduce noise, as described in U.S. Pat. No. 8,110,883, which includes the generations of excitons to produce heat in the IR sensing element to change the TCR response and thereby sensitivity. Carbon nanotubes also have high absorption coefficients of $10^{-4}$ to $10^{-5}$, which is higher than HgCdTE in the 8-12 micron region.

SUMMARY OF THE INVENTION

The present disclosure relates to microbolometer structures that increase the sensitivity of microbolometers to less than 1 mK in some examples. Such NEDT values were only previously met by cooled Mercury Cadmium Tellurium detectors.

This present disclosure uses a technique which senses change in resistance from the photon flux impinging on the detector. This type of detector is called a bolometer which uses metallic, semi metallic or semiconducting materials which has the inherent characteristic of a temperature coefficient of resistance (TCR). Amorphous silicon (or vanadium oxide) is deposited on a cantilever beam which are fabricated on top of a CMOS wafer which contains readout circuitry. One of the advantages of this technology has been the fabrication compatibility with CMOS processing which has resulted in a use of wafer processing and thereby lower costs by increasing yields and realizing economies of scale of wafer level integration and processing.

These detectors can be designed into IR focal plane arrays (IRFPAs) which are most sensitive in the LWIR (8-12 microns) and MWIR (3-5 microns). HgCdTe IR detector technology, which is cooled to 77 K for optimal operation used mechanical coolers which limited application to IR systems because of weight, size and cost.

An Infrared (IR) detector comprising: a substrate; a thin film of Silicon-CNT nanocomposite deposited on the existing vanadium oxide or amorphous thin film suspended over the substrate and between electrical contacts; first and second conductive contacts in electrical communication with the thin film either Vanadium oxide or amorphous Si of Silicon-CNT or Si-CNT nanocomposites; a layer of amorphous silicon on the substrate; means for forming a cavity in the amorphous silicon layer to thereby create a gap between the bundled carbon nanotube fabric and the substrate such that the bundled carbon nanotube fabric is suspended above the substrate, thereby fabricating the IR detector; wherein the thin film of bundled carbon nanotubes is tuned to be sensitive to IR radiation in the micron band of 1 to 12 microns and the exposure of IR radiation induces a change in impedance between the first and second conductive terminals which is sensed by CMOS readout circuitry.

One formulation of the vanadium oxide or α-Silicon-CNT nanocomposite is to deposit a aligned, partially aligned or non-aligned carbon nanotube film via a horizontal orientation using one of a spin on process using centrifugal forces or a spray on technique. The CNT film is then etched in a Hydrogen or Chlorine discharge inducing defects in the carbon-carbon bonds causing dangling bonds which will serve as bonding sites for the Silicon or vanadium oxide nanoparticles.

A second formulation of the vanadium oxide or Silicon-CNT nanocomposite is to mix carbon nanotubes with either vanadium oxide or Silicon in a concentration of 0.01 to 10 percent by volume in a conjugated polymer or epoxy and then apply to the surface of the existing vanadium oxide thin film. The modulation of CNT/Silicon or vanadium oxide concentration will result in increased percolation and thermal conductivity resulting in the capability to tune the temperature coefficient of resistance.

A third method is to deposit a low Van der Walls non-continuous thin film such as SixNy, SiO2, doped silicon or other thin film dielectrics followed by the deposition of aligned, partially aligned or non-aligned carbon nanotube film via a horizontal orientation using one of a spin on process using centrifugal forces or a spray on technique. In the CNT film are Silicon or vanadium oxide nanoparticles attached to binding sites via a technique where the CNT films are etched in a Hydrogen or Chlorine discharge inducing defects in the carbon-carbon bonds causing dangling bonds which will serve as bonding sites for the Silicon nanoparticles. This technique will enable electrical contact between the underlying vanadium oxide film and the CNT-Silicon or vanadium oxide nanocomposite.

In one example, the detector further comprising sensing circuitry for detecting changes in input impedance using the CMOS readout circuitry.

In one example, the thin film of Silicon or vanadium nanoparticles-CNT nanocomposites is deposited on the substrate having an insulating layer comprised of dielectric material with a cantilever beam composed of silicon nitride, which is suspended over a channel, thereby providing thermal isolation from surrounding environments.

In one example, the thin film of Silicon or vanadium nanoparticles-CNT nanocomposites is composed of single wall or multi-wall carbon nanotubes having diameters corresponding to a tuned IR response wavelength.

In one example, the thin film of Silicon or vanadium oxide nanoparticles-CNT nanocomposite is composed of multi wall carbon nanotubes having diameters corresponding to a tuned IR response wavelength.

In one example, the thin film of Silicon or vanadium oxide nanoparticles-CNT nanocomposite is composed of single wall carbon nanotubes and multi wall carbon nanotubes having diameters corresponding to a tuned IR responsive wavelength.

In one example, the Silicon or vanadium oxide nanoparticles-CNT nanocomposite are deposited on the substrate in a horizontal orientation using one of a spin on process using centrifugal forces or a spray on technique.

In one example, the means for forming a cavity includes means for etching the amorphous silicon as the sacrificial layer.

In one example, the means for forming a cavity includes means for etching the amorphous silicon using Xenon difluoride (XeF2) etching techniques.

An Infrared (IR) detector comprising: a thin film Silicon or vanadium oxide nanoparticles-CNT nanocomposite suspended between electrical contacts; first and second conductive terminals in electrical communication with the thin film of bundled nanotubes; wherein the thin film of Silicon nanoparticles-CNT nanocomposite is tuned to be sensitive to IR radiation in the micron band of 1 to 12 microns and the exposure of IR radiation induces a change in impedance between the first and second conductive terminals which is sensed by CMOS readout circuitry; and wherein the thin film of bundled carbon nanotubes is tuned to increase sensitivity of the IR detector by increasing the density of the random, partially aligned and aligned carbon nanotubes, which thereby increases the temperature coefficient of resistance (TCR) to excess of 4% per degree centigrade, while decreasing the noise floor from contributors such as 1/f or Johnson sources and thereby resulting in a Noise Equivalent Delta Temperature (NEDT) of less than 10 mK.

An Infrared (IR) detector comprising: a thin film of Silicon or vanadium oxide nanoparticles-CNT nanocomposite suspended between electrical contacts; first and second conductive terminals in electrical communication with the thin film of Silicon or vanadium nanoparticles-CNT nanocomposite; wherein the thin film of bundled carbon nanotubes is tuned to be sensitive to IR radiation in the micron band of 1 to 12 microns and the exposure of IR radiation induces a change in impedance between the first and second conductive terminals which is sensed by CMOS readout circuitry; and wherein the carbon nanotube is a polymer fabric having a thermal coefficient of resistance (TCR) in the range of 1% per degree centigrade and up to 6% per degree centigrade.

An Infrared (IR) detector comprising: a thin film Silicon vanadium oxide nanoparticles-CNT nanocomposite suspended between electrical contacts; first and second conductive terminals in electrical communication with the thin film of random, partially aligned or aligned nanotubes; wherein the thin film of bundled carbon nanotubes is tuned to be sensitive to IR radiation in the micron band of 1 to 12 microns and the exposure of IR radiation induces a change in impedance between the first and second conductive terminals which is sensed by CMOS readout circuitry; and wherein the carbon nanotubes are aligned in bundles by one of: use of electromagnetic field to align the carbon tubes, use of nanogroves sprayed with a hydrophobic compound which aligns the nanotubes, or through modification of surfactant in an aqueous solution of nanotubes to maximize nanotube clumping.

In one example, the hydrophobic compound comprises one of saline and a derivative thereof, including aminopropyltriethoxysilane.

A method for fabricating an infrared (IR) detector, the method comprising the steps of: depositing a silicon oxide film on a substrate; create a hole over a tungsten plug provided in the substrate and disposed below the silicon oxide film; depositing a thin film of copper on the substrate so that the copper film serves as an IR photon reflector; depositing a layer of amorphous silicon on the substrate and planarizing the layer of amorphous silicon; etch contact holes through the amorphous silicon to clear the amorphous silicon layer and the copper film layer down to a tungsten plug disposed in the substrate; deposit a CMOS interconnect thin films in the hole above the tungsten plug and delineate interconnect structures; depositing a layer of Silicon or nanoparticles nanoparticles-CNT nanocomposite on the substrate; and etching a cavity in the amorphous silicon layer to thereby create a gap between the bundled carbon nanotube fabric and the substrate such that the bundled carbon nanotube fabric is suspended above the substrate, thereby fabricating the IR detector.

In one example, the silicon oxide film is deposited using standard CMOS microelectronics processing techniques.

In one example, the thin film of copper is deposited using one of electron bean evaporation and direct current sputtering.

In one example, the interconnect structures are delineated using standard photolithographic and dry etch techniques.

In one example, the cavity is etched in the amorphous silicon using Xenon difluoride (XeF2) etching techniques.

An infrared (IR) detector comprising: a substrate having tungsten plugs deposited therein and having a CMOS readout circuitry operatively connected thereto; a layer of silicon oxide deposited on the substrate and the layer of silicon including a hole over the tungsten plugs; a layer of copper is deposited on the layer of silicon oxide, the layer of copper acting as an IR photon reflector; a layer of amorphous silicon deposited on the substrate and the layer of copper, the layer of amorphous silicon being further planarized; at least one contact hole etched through the layer of amorphous silicon so as to clear the at least one contact hole down to an underlying tungsten plug; a layer of CMOS interconnect deposited in the at least one hole; a layer of carbon nanotubes deposited on the substrate; and wherein the layer of carbon nanotubes are suspended over the substrate via an etching technique that creates a gap between the layer of carbon nanotubes and the underlying substrate, thereby generating the IR detector.

In one example, the hole is created using a photolithography procedure.

A method for fabricating an infrared (IR) detector, the method comprising the steps of: providing a substrate; forming first and second spaced apart conductive terminals in the substrate; forming a thin metal film on the substrate so that the metal film serves as an IR photon reflector layer; depositing a layer of amorphous silicon on the substrate; forming a CMOS interconnect thin film above the conductive terminals and delineate interconnect structures; depositing a layer of bundled carbon nanotubes on the substrate; and etching a cavity in the amorphous silicon layer to thereby create a gap between the bundled carbon nanotube fabric and the substrate such that the bundled carbon nanotube fabric is suspended above the substrate, thereby fabricating the IR detector.

In one example, the interconnect structures are delineated using standard photolithographic and dry etch techniques.

In one example, the cavity is etched in the amorphous silicon using Xenon difluoride (XeF2) etching techniques.

An Infrared (IR) detector comprising: a substrate; a thin film of Silicon-CNT nanocomposites deposited on the existing vanadium oxide thin film suspended over the substrate and between electrical contacts; first and second conductive contacts in electrical communication with the thin film amorphous Si or vanadium oxide of Si-CNT nanocomposites; a layer of amorphous silicon on the substrate; means for forming a cavity in the amorphous silicon or the vanadium oxide layer to thereby create a gap between the bundled carbon nanotube fabric and the substrate such that the bundled carbon nanotube fabric is suspended above the substrate, thereby fabricating the IR detector; wherein the thin film of bundled carbon nanotubes is tuned to be sensitive to IR radiation in the micron band of 1 to 12 microns and the exposure of IR radiation induces a change in impedance between the first and second conductive terminals which is sensed by CMOS readout circuitry.

One formulation of the vanadium oxide orSilicon-CNT nanocomposite is to deposit a aligned, partially aligned or non-aligned carbon nanotube film via a horizontal orientation using one of a spin on process using centrifugal forces or a spray on technique. The CNT film is then etched in a Hydrogen or Chlorine discharge inducing defects in the carbon-carbon bonds causing dangling bonds which will serve as bonding sites for the Si nanoparticles.

A second formulation of the vanadium oxide or Si nanoparticles-CNT nanocomposite is to mix carbon nanotubes and Si in a concentration of 0.01 to 10 percent by volume in a conjugated polymer or epoxy and then apply to the surface of the existing vanadium oxide thin film. The modulation of CNT/Si or vanadium oxide concentration will result in increased percolation and thermal conductivity resulting in the capability to tune the temperature coefficient of resistance.

A third method is to deposit a low Van der Walls non-continuous thin film such as SixNy, SiO2, doped silicon or other thin film dielectrics followed by the deposition of aligned, partially aligned or non-aligned carbon nanotube film via a horizontal orientation using one of a spin on process using centrifugal forces or a spray on technique. In the CNT film are Si nanoparticles attached to binding sites via a technique where the CNT films are etched in a Hydrogen or Chlorine discharge inducing defects in the carbon-carbon bonds causing dangling bonds which will serve as bonding sites for the Si nanoparticles. This technique will enable electrical contact between the underlying vanadium oxide film and the CNT-Si nanocomposite. It is feasible to create strips of detecting material which will result in increased MTF.

In one example, the detector further comprising sensing circuitry for detecting changes in input impedance using the CMOS readout circuitry.

In one example, the thin film of Si or vanadium oxide nanoparticles-CNT nanocomposites is deposited on the substrate having an insulating layer comprised of dielectric material with a cantilever beam composed of silicon nitride, which is suspended over a channel, thereby providing thermal isolation from surrounding environments.

In one example, the thin film of Si or vanadium nanoparticles-CNT nanocomposites is composed of single wall carbon nanotubes having diameters corresponding to a tuned IR response wavelength.

In one example, the thin film of Si or vanadium nanoparticles-CNT nanocomposite is composed of multi wall carbon nanotubes having diameters corresponding to a tuned IR response wavelength.

In one example, the thin film of Si or vanadium oxide nanoparticles-CNT nanocomposite is composed of single wall carbon nanotubes and multi wall carbon nanotubes having diameters corresponding to a tuned IR responsive wavelength.

In one example, the vanadium or Si nanoparticles-CNT nanocomposite are deposited on the substrate in a horizontal orientation using one of a spin on process using centrifugal forces or a spray on technique.

In one example, the means for forming a cavity includes means for etching the amorphous silicon.

In one example, wherein the means for forming a cavity includes means for etching the amorphous silicon using Xenon difluoride (XeF2) etching techniques.

An Infrared (IR) detector comprising: a thin film Si or vanadium oxide nanoparticles-CNT nanocomposite suspended between electrical contacts; first and second conductive terminals in electrical communication with the thin film of bundled nanotubes; wherein the thin film of Silicon nanoparticles-CNT nanocomposite is tuned to be sensitive to IR radiation in the micron band of 1 to 12 microns and the exposure of IR radiation induces a change in impedance between the first and second conductive terminals which is sensed by CMOS readout circuitry; and wherein the thin film of bundled carbon nanotubes is tuned to increase sensitivity of the IR detector by increasing the density of the bundled carbon nanotubes, which thereby increases the temperature coefficient of resistance (TCR) to excess of 4% per degree centigrade, thereby resulting in a Noise Equivalent Delta Temperature (NEDT) of less than 10 mK.

An Infrared (IR) detector comprising: a thin film of Si or vanadium oxide nanoparticles-CNT nanocomposite suspended between electrical contacts; first and second conductive terminals in electrical communication with the thin film of Si or vanadium oxide nanoparticles-CNT nanocomposite; wherein the thin film of bundled carbon nanotubes is tuned to be sensitive to IR radiation in the micron band of 1 to 12 microns and the exposure of IR radiation induces a change in impedance between the first and second conductive terminals which is sensed by CMOS readout circuitry; and wherein the carbon nanotube is a polymer fabric having a thermal coefficient of resistance (TCR) in the range of 1% per degree centigrade and up to 6% per degree centigrade.

An Infrared (IR) detector comprising: a thin film Si or vanadium oxide nanoparticles-CNT nanocomposite suspended between electrical contacts; first and second conductive terminals in electrical communication with the thin film of bundled nanotubes; wherein the thin film of bundled carbon nanotubes is tuned to be sensitive to IR radiation in the micron band of 1 to 12 microns and the exposure of IR radiation induces a change in impedance between the first and second conductive terminals which is sensed by CMOS readout circuitry; and wherein the carbon nanotubes are aligned in bundles by one of: use of electromagnetic field to align the carbon tubes, use of nanogroves sprayed with a hydrophobic compound which aligns the nanotubes, or through modification of surfactant in an aqueous solution of nanotubes to maximize nanotube clumping.

In one example, the hydrophobic compound comprises one of saline and a derivative thereof, including aminopropyltriethoxysilane.

A method for fabricating an infrared (IR) detector, the method comprising the steps of: depositing a silicon oxide film on a substrate; create a hole over a tungsten plug provided in the substrate and disposed below the silicon oxide film; depositing a thin film of copper on the substrate so that the copper film serves as an IR photon reflector; depositing a layer of amorphous silicon on the substrate and planarizing the layer of amorphous silicon; etch contact holes through the amorphous silicon to clear the amorphous silicon layer and the copper film layer down to a tungsten plug disposed in the substrate; deposit a CMOS interconnect thin films in the hole above the tungsten plug and delineate interconnect structures; depositing a layer of Si nanoparticles-CNT nanocomposite on the substrate; and etching a cavity in the amorphous silicon layer to thereby create a gap between the bundled carbon nanotube fabric and the substrate such that the bundled carbon nanotube fabric is suspended above the substrate, thereby fabricating the IR detector.

In one example, the silicon oxide film is deposited using standard CMOS microelectronics processing techniques.

In one example, the thin film of copper is deposited using one of electron bean evaporation and direct current sputtering.

In one example, the interconnect structures are delineated using standard photolithographic and dry etch techniques.

In one example, the cavity is etched in the amorphous silicon using Xenon difluoride (XeF2) etching techniques.

An infrared (IR) detector comprising: a substrate having tungsten plugs deposited therein and having a CMOS readout circuitry operatively connected thereto; a layer of silicon oxide deposited on the substrate and the layer of silicon including a hole over the tungsten plugs; a layer of copper is deposited on the layer of silicon oxide, the layer of copper acting as an IR photon reflector; a layer of amorphous silicon deposited on the substrate and the layer of copper, the layer of amorphous silicon being further planarized; at least one contact hole etched through the layer of amorphous silicon so as to clear the at least one contact hole down to an underlying tungsten plug; a layer of CMOS interconnect deposited in the at least one hole; a layer of carbon nanotubes deposited on the substrate; and wherein the layer of carbon nanotubes are suspended over the substrate via an etching technique that creates a gap between the layer of carbon nanotubes and the underlying substrate, thereby generating the IR detector.

In one example, the hole is created using a photolithography procedure.

A method for fabricating an infrared (IR) detector, the method comprising the steps of: providing a substrate; forming first and second spaced apart conductive terminals in the substrate; forming a thin metal film on the substrate so that the metal film serves as an IR photon reflector layer; depositing a layer of amorphous silicon on the substrate; forming a CMOS interconnect thin film above the conductive terminals and delineate interconnect structures; depositing a layer of bundled carbon nanotubes on the substrate; and etching a cavity in the amorphous silicon layer to thereby create a gap between the bundled carbon nanotube fabric and the substrate such that the bundled carbon nanotube fabric is suspended above the substrate, thereby fabricating the IR detector.

In one example, the interconnect structures are delineated using standard photolithographic and dry etch techniques.

In one example, the cavity is etched in the amorphous silicon using Xenon difluoride (XeF2) etching techniques.

Infrared (IR) radiation detecting and sensing systems using V2O3/Amorphous silicon-carbon nanotubes nanocomposites and methods to making the same. In certain embodiments of the invention, it includes, a thermally isolated microbridge structure, random, aligned or bundled carbon nanotubes applied, first and second conducting interconnects each in electrical communication with the nanotubes. The entire microbridge structure is fabricated on a CMOS wafer with a readout design. Percolation among aligned, partially or nonaligned CNT-Silicon nanocomposites can be optimized for the IR detector application by modulating the densities of CNTs and amorphous silicon or vanadium oxide nanoparticles concentration in the thin film. The device is a microbolometer type where the ability to resolve smaller changes in temperature is highly desirable resulting in higher sensitivity IRFPAs. Three different methods for constructing the detector proposed in this application include a combination of thin films where the interface between an existing V2O3 or amorphous thin film on a suspended MEMS structure a V2O3 or silicon nanoparticle serves as the interface between the existing film and the aligned, partially aligned or random carbon nanotubes The second type is a CNT-amorphous Silicon or vanadium oxide nanocomposites mixed with an conjugated epoxy where the existing α-Silicon or V2O3 thin film is etched resulting in Si—Si or V—C bonding increasing electrical conduction, the third is to deposit a <10A layer of various low Van Der Waals non-continuous thin films such as Si3N4 and attach a CNT-Silicon nanocomposites to the underlying α-Silicon or V2O3 thin film. Areas that are attached result in strips that increase the MTF (modulation transfer function) of the resulting IR detector pixel. The increase in temperature coefficient of resistance claimed within results in IR detectors capable of NEDT of less than 10 mK at low cost is due to minimizing noise sources resulting in a higher sensitivity IR detector.

With the use of silicon or vanadium oxide nanoparticles in an aligned, partially aligned or random carbon nanotube network, the increase to IR detection sensitivity (NEDT) or MTF is due to either reduction in the noise sources such as 1/f or Johnson noise. MTF can be improved by using the same nanocomposite with the addition of low van der Waals thin films either deposited or lithographically delineated to create stripes of highly sensitive IR detecting material resulting in improved MTF. These IR detector arrays can be fabricated in existing CMOS circuitry without impact on the underlying circuits.

BRIEF DESCRIPTION OF THE DRAWINGS

The invention description below refers to the accompanying drawings, of which.

DETAILED DESCRIPTION

The present disclosure relates to microbolometer structures having top layers of amorphous silicon or vanadium oxide. In some examples, combinations of carbon nanotubes, nanoparticles, and/or thin films can be deposited atop the existing top layer of amorphous silicon or top layer of vanadium oxide of a microbolometer structure. Such configurations can increase the sensitivity of the microbolometers to less than 4 mK, less than 2 mK, and in some examples less than 1 mK.

Figure 1A:
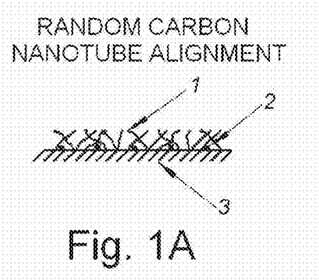
FIG. 1A depicts a top layer of a microbolometer detector structure according to one or more aspects of the disclosure.

FIG. 1A depicts a top layer of a microbolometer detector structure according to one or more aspects of the disclosure. As shown in FIG. 1A, the top layer of the microbolometer detector can include a layer 3 and a layer of unaligned (e.g., randomly aligned) carbon nanotubes 1 deposited upon a surface of the layer 3. The layer 3 can be any type of substrate suitable for use in a microbolometer, and in this example can be amorphous silicon (also referred to as α-silicon) or vanadium oxide, e.g., VxOy.

The carbon nanotubes 1 can include nanoparticles 2 dispersed or mixed therewith to form a dispersion solution of carbon nanotubes 1 and nanoparticles 2, also referred to herein as a nanocomposite. The nanoparticles 2 can include any type of nanoparticles, such as one or more of silicon nanoparticles and/or vanadium oxide nanoparticles. The nanoparticles 2 can be dispersed within the dispersion solution approximately 0.05% to 10% by volume (e.g., +/−0.05%), with the carbon nanotubes 1 making up the remaining volume of the dispersion solution. The nanoparticles 2 can also be deposited within the layer 3, forming a composite layer of α-silicon or vanadium oxide and silicon nanoparticles or vanadium oxide nanoparticles, in any combination. Such combinations can include, for example a layer of α-silicon and silicon nanoparticles, a layer of α-silicon and vanadium oxide nanoparticles, a layer of vanadium oxide and silicon nanoparticles, or a layer of vanadium oxide and vanadium oxide nanoparticles.

During fabrication of the example of FIG. 1A, which will be described in greater detail below, the nanoparticles 2 can be deposited atop the layer 3. After deposition of the nanoparticles 2, an anneal step can be conducted to stabilize the nanoparticles 2 within the carbon nanotube 1 matrix to form the dispersion solution. In other examples, the nanotubes 1 can be deposited first and the nanoparticles 2 can be deposited second.

In the example of FIG. 1A above, improved noise floor and NEDT values can be realized. For example, experimental data has shown NEDT values of less than 4 mK and noise floor values of approximately 0.1 mV RMS.

Figure 1B:
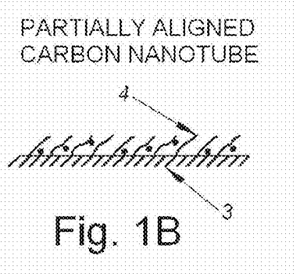
FIG. 1B depicts a top layer of a microbolometer detector structure according to one or more aspects of the disclosure.

FIG. 1B depicts a top layer of a microbolometer detector structure according to one or more aspects of the disclosure. As shown in FIG. 1B, the top layer of the microbolometer detector can include a layer 3 and a layer of partially aligned carbon nanotubes 4 deposited thereupon. Partial alignment of carbon nanotubes 4 can be realized by providing clumps of aligned nanotubes and surrounding the clumps of aligned nanotubes by individual or clumps of unaligned nanotubes. In another example, partially aligned nanotubes can be provided by a first clump of nanotubes with a first alignment and a second clump of nanotubes with a second alignment different from the first alignment. The layer 3 can be any type of substrate suitable for use in a microbolometer, and in this example can be amorphous silicon (i.e., α-silicon) or vanadium oxide, e.g., VxOy.

The carbon nanotubes 4 can include nanoparticles 2 dispersed or mixed therewith to form a dispersion solution of carbon nanotubes 1 and nanoparticles 2. The nanoparticles 2 can include any type of nanoparticles, such as one or more of silicon nanoparticles and/or vanadium oxide nanoparticles. The nanoparticles 2 can be dispersed within the dispersion solution approximately 0.05% to 10% by volume (e.g., +/−0.05%), with the carbon nanotubes 4 making up the remaining volume of the dispersion solution. The nanoparticles 2 can also be deposited within the layer 3, forming a composite layer of α-silicon or vanadium oxide and silicon nanoparticles or vanadium oxide nanoparticles, in any combination. Such combinations can include, for example a layer of α-silicon and silicon nanoparticles, a layer of α-silicon and vanadium oxide nanoparticles, a layer of vanadium oxide and silicon nanoparticles, or a layer of vanadium oxide and vanadium oxide nanoparticles.

During fabrication of the example of FIG. 1B, a surface of layer 3 (of amorphous silicon or vanadium oxide) is etched in an argon glow discharge or by an Ion Bombardment source to break the vanadium or silicon bonds. The silicon or vanadium oxide nanoparticles 2 are deposited in casting solution followed by an anneal. Next the carbon nanotubes are deposited in a partially aligned fashion, followed by an anneal step. In other examples, the nanotubes can be deposited first and the nanoparticles can be deposited thereafter.

In the example of FIG. 1B above, improved noise floor and NEDT values can be realized. For example, experimental data has shown NEDT values of less than 2 mK and noise floor values of approximately 0.1 mV RMS.

Figure 1C:
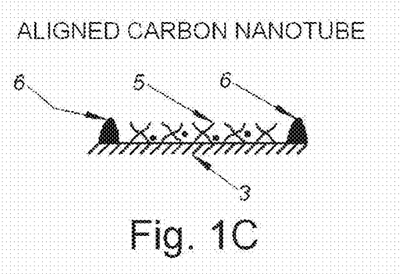
FIG. 1C depicts a top layer of a microbolometer detector structure according to one or more aspects of the disclosure.

FIG. 1C depicts a top layer of a microbolometer detector structure according to one or more aspects of the disclosure. As shown in FIG. 1C, the top layer of the microbolometer detector can include a layer 3 and a layer of aligned carbon nanotubes 5 deposited thereupon. The layer 3 can be any type of substrate suitable for use in a microbolometer, and in this example can be amorphous silicon (also referred to as α-silicon) or vanadium oxide, e.g., VxOy.

The carbon nanotubes 5 can include nanoparticles 2 dispersed or mixed therewith to form a dispersion solution of carbon nanotubes 5 and nanoparticles 2. The nanoparticles 2 can include any type of nanoparticles, such as one or more of silicon nanoparticles and/or vanadium oxide nanoparticles. The nanoparticles 2 can be dispersed within the dispersion solution approximately 0.05% to 10% by volume (e.g., +/−0.05%), with the carbon nanotubes 5 making up the remaining volume of the dispersion solution. The nanoparticles 2 can also be deposited within the layer 3, forming a composite layer of α-silicon or vanadium oxide and silicon nanoparticles or vanadium oxide nanoparticles, in any combination. Such combinations can include, for example a layer of α-silicon and silicon nanoparticles, a layer of α-silicon and vanadium oxide nanoparticles, a layer of vanadium oxide and silicon nanoparticles, or a layer of vanadium oxide and vanadium oxide nanoparticles.

In this example, a thin non-continuous film 6 can be deposited on the layer 3. The film 6 can have a thickness (e.g., height above a surface of the layer 3) of less than five angstroms and can be formed of any material having low stiction properties and a low Van der Waals force. In one example, the film can include at least one of a silicon nitride ($Si_3N_4$) film and/or an amorphous silicon film. The film 6 can comprise a nonuniform distribution of islands atop the layer 3 at nonuniform intervals.

During fabrication, the film 6 can be deposited using chemical vapor deposition. As described above, the dispersion solution, including a mixture of carbon nanotubes and nanoparticles (vanadium oxide or silicon) is deposited at regions where the film is not deposited atop the layer 3. In areas where the film 6 does not contact the layer 3 (e.g., a space defined between adjacent islands of film 6), the nanoparticles adhere to the layer 3. However, at areas with the film 6 contacts the layer 3, the nanoparticles do not adhere to the layer 3. Moreover, the nanoparticles and carbon nanotubes do not adhere to any portion of the film 6, thereby creating a gap between the film 6 and the nanotube/nanoparticle mixture. This configuration, which can be described as stripes in the detector surface, can increase modulation transfer function and overall efficiency of the detector.

In the example of FIG. 1C above, improved noise floor and NEDT values can be realized. For example, experimental data has shown NEDT values of less than 1 mK and noise floor values of approximately 0.05 mV RMS.

One advantage of the present disclosure is that the use of Silicon or vanadium oxide nanoparticles dispersed within a carbon nanotube matrix provides increased optical electrical and thermal conductivity beyond the existing α-Silicon or vanadium oxide films, which will result in a wider range in sensitivity. Combining the α-silicon and/or vanadium oxide film with a CNT nanocomposite results in increased sensitivity due to minimization of the noise floor. Although described above, such improved sensitivity can be summarized in the following table:

| FIG. 1A | FIG. 1B | FIG. 1C |
| --- | --- | --- |
| NEDT of <4 mK | NEDT of <2 mK | NEDT of <1 mK |
| Noise floor | Noise floor | Noise floor |
| 0.1 mV RMS | 0.1 mV RMS | 0.05 mV RMS |

Figure 4:
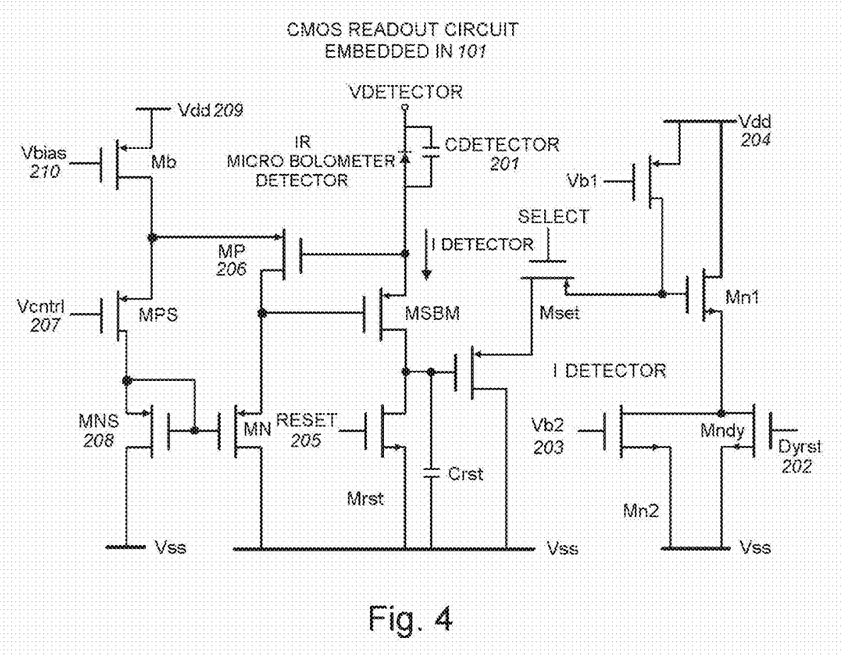
FIG. 4 depicts a CMOS readout circuit of a microbolometer structure (either amorphous silicon or vanadium oxide)
Figure 5:
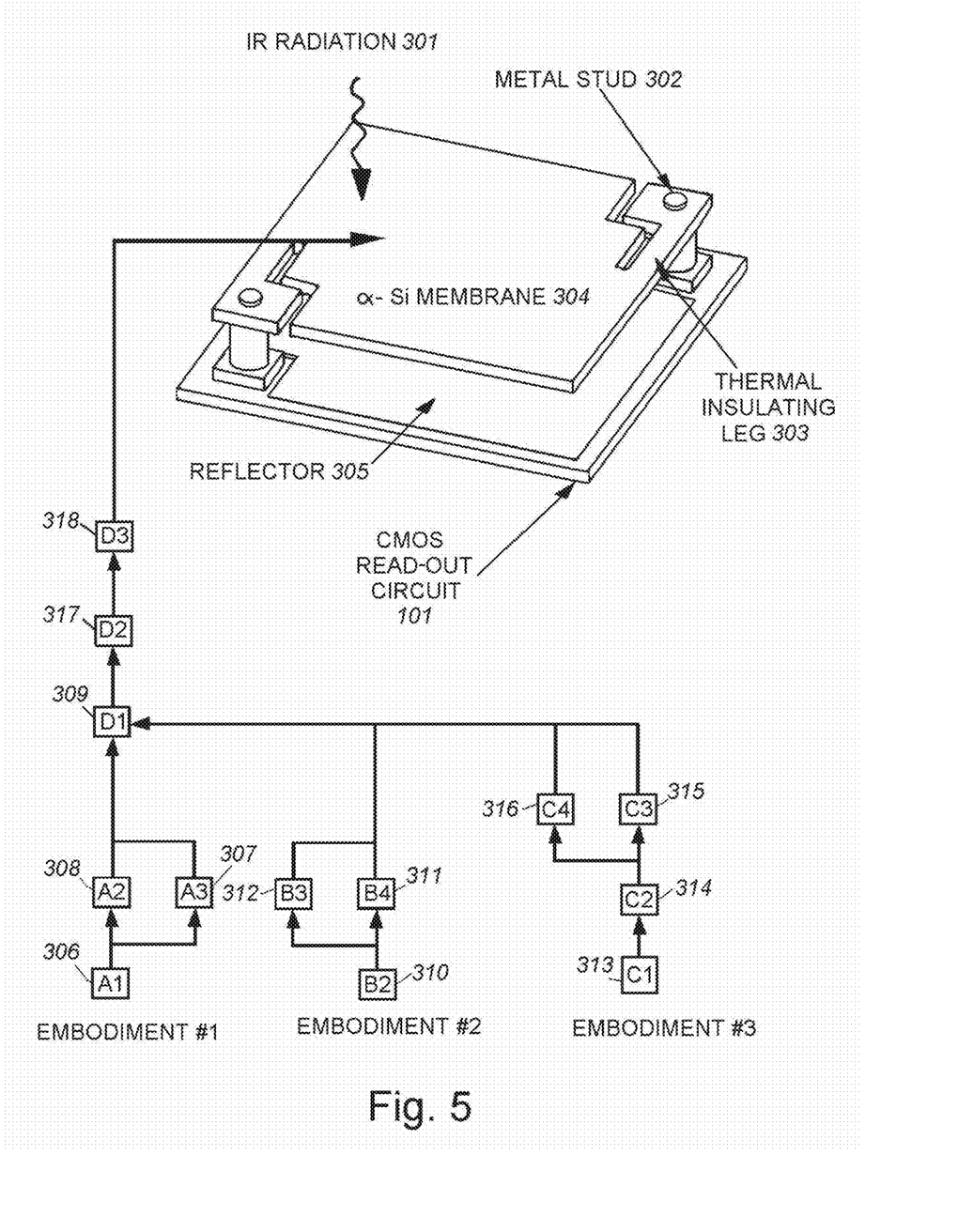
FIG. 5 depicts a process flow of depositing nanotubes, nanoparticles, and/or a thin film upon an amorphous silicon microbolometer structure.
Figure 6:
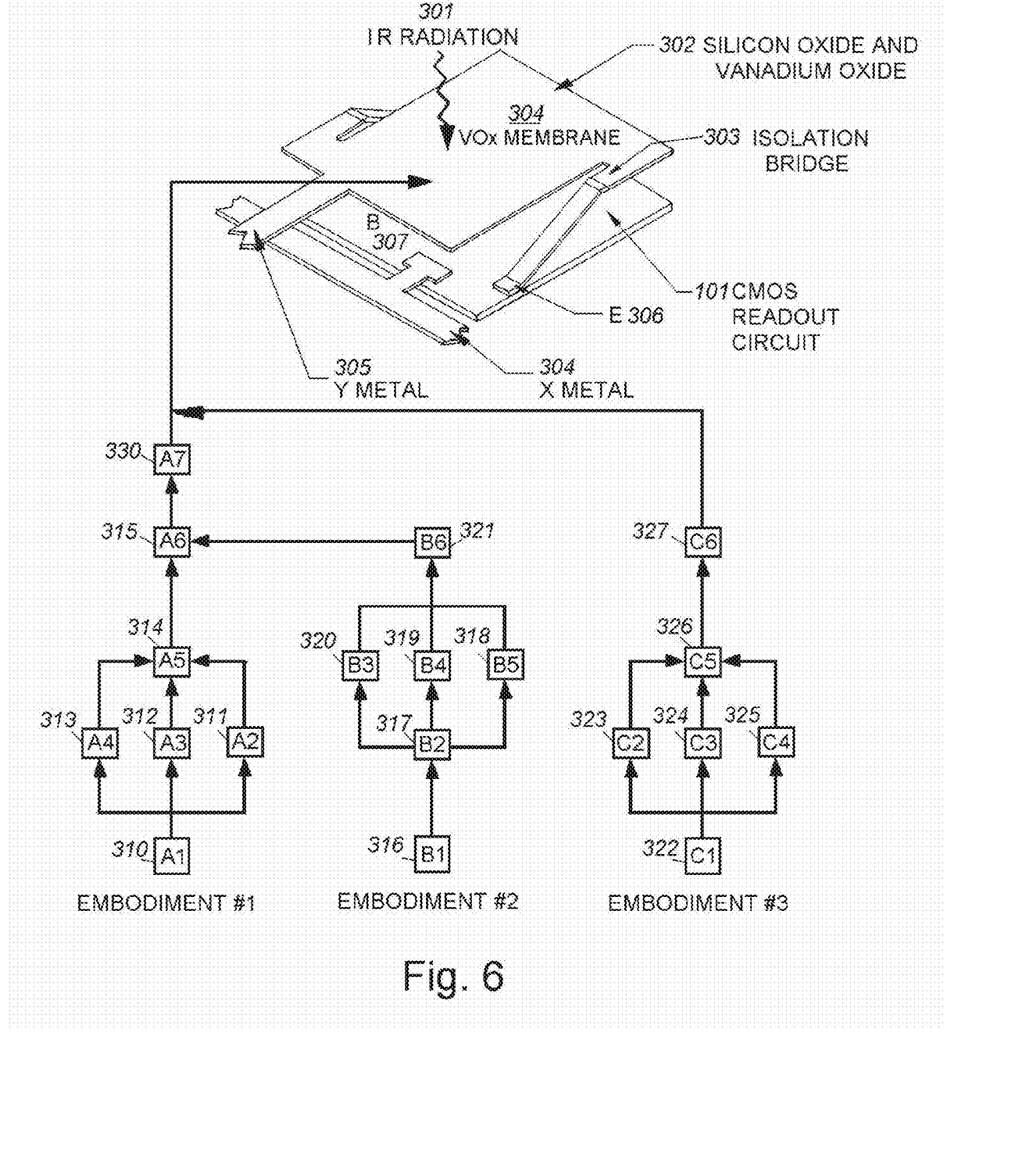
FIG. 6 depicts a process flow of depositing nanotubes, nanoparticles, and/or a thin film upon a vanadium oxide microbolometer structure.

As will be described in greater detail below, examples of FIGS. 1A-C are designed and configured to be carried out on top of the top surface of an existing amorphous silicon or vanadium oxide surface of a microbolometer detector, such as layer 3 above. As will be described in greater detail below, FIGS. 2A-F depict an amorphous silicon microbolometer structure at various stages in a method of manufacturing according to one or more aspects of the disclosure. FIGS. 3A-F depict a vanadium oxide microbolometer structure at various stages in a method of manufacturing according to one or more aspects of the disclosure. FIG. 4 depicts a CMOS readout circuit of a microbolometer structure (either amorphous silicon or vanadium oxide). FIG. 5 depicts a process flow of depositing nanotubes, nanoparticles, and/or a thin film upon an amorphous silicon microbolometer structure. FIG. 6 depicts a process flow of depositing nanotubes, nanoparticles, and/or a thin film upon a vanadium oxide microbolometer structure.

FIGS. 2A-F depict an amorphous silicon microbolometer structure at various stages in a method of manufacturing according to one or more aspects of the disclosure.

Due to the mechanical properties of the microbolometer structure and in order not to modify the underlying CMOS circuit performance, the next steps for the three proposed embodiments must not surpass 150 degrees C. or use etch chemistries that are incompatible with the underlying structure. Such incompatible etch chemistries include chemistries including carbon of any kind, as the use of carbon could result in carbon entering the cavity 111, which could render the detector structure inoperable.

Figure 2A:
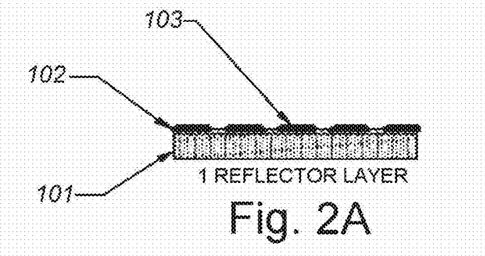
FIGS. 2A-F depict a amorphous silicon microbolometer structure at various stages in a method of manufacturing according to one or more aspects of the disclosure.

At FIG. 2A, using standard CMOS microelectronics processing techniques, a layer 102 of SiO2 is deposited on a substrate 101 (including Si and/or CMOS circuitry). A photolithography method is used to create one or more delineated holes over tungsten plugs (e.g. metal studs 302), which serve as interconnects to the underlying CMOS pre-amplification circuitry. Electron beam evaporation or direct current sputtering can be used to deposit a reflection layer 103 on the layer 102. The reflection layer 103 can comprise either copper or gold and can serve as an IR photon reflector. The layer 103 can be delineated into a square which will define the ultimate detector cavity (element 111 described below).

Figure 2B:
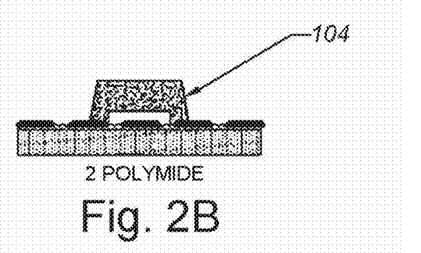

At FIG. 2B, a layer 104 of sacrificial material, such as polyimide of amorphous silicon, is deposited atop the reflection layer 103 and delineated into the same pattern as layer 103 using photolithographic techniques.

Figure 2C:
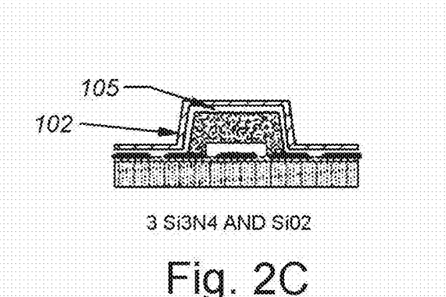

At FIG. 2C, a thin film 105 of $Si_3N_4$ and $SiO_2$ is deposited on top of the sacrificial layer 104. The $Si_3N_4$ can be deposited first and the $SiO_2$ can be deposited atop the $Si_3N_4$, with the combination of the layers forming thin film 105 atop the polyimide layer 104.

Figure 2D:
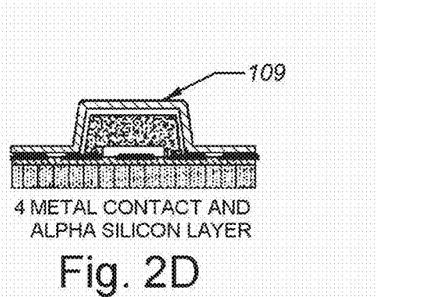

At FIG. 2D, a thin film 109 of amorphous silicon can be deposited using ion assisted deposition technique of chemical vapor deposition. The thin film 109 can be planarized using chemical-mechanical polishing.

Figure 2E:
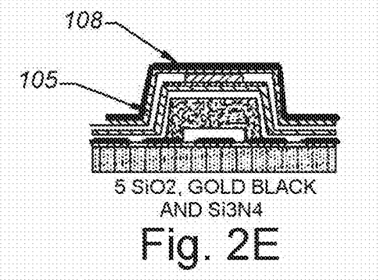

At FIG. 2E, thin films of $SiO_2$, gold black and $Si_3N_4$ can be deposited to form film 108 atop thin film 109. The films of $SiO_2$, gold black and $Si_3N_4$ are selected to as to minimize reflections and to provide mechanical structure of the microbolometer structure.

Figure 2F:
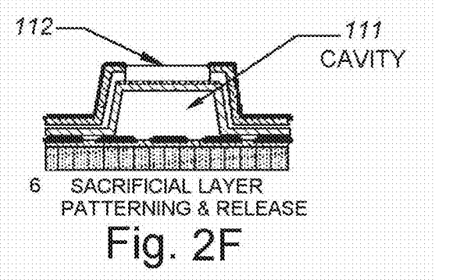
Figure 3A:
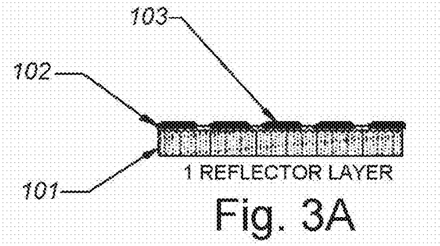
FIGS. 3A-F depict a vanadium oxide microbolometer structure at various stages in a method of manufacturing according to one or more aspects of the disclosure.
Figure 3B:
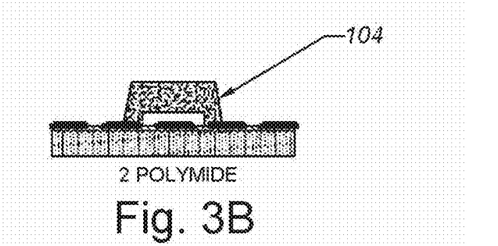
Figure 3C:
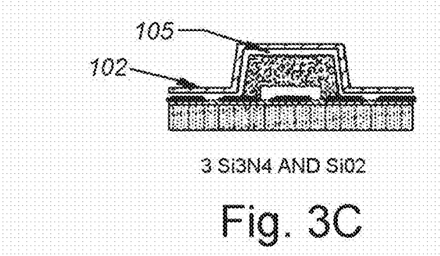
Figure 3D:
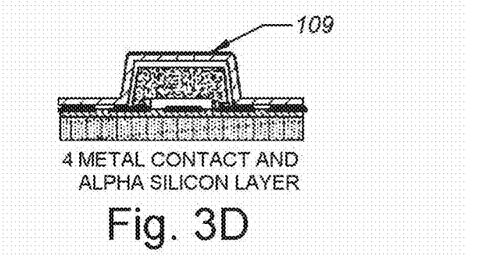
Figure 3E:
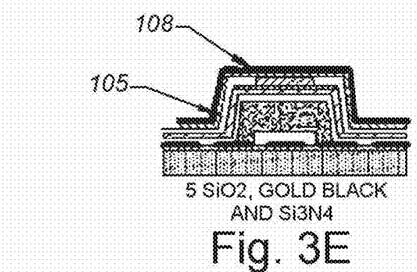
Figure 3F:
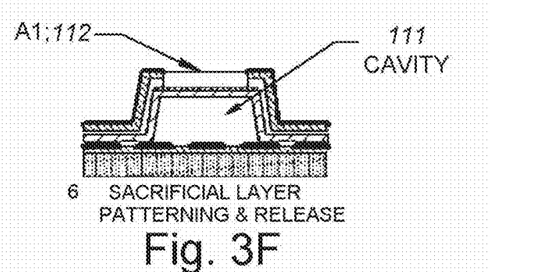

At FIG. 2F, the sacrificial layer can be etched to create the detector cavity 111 and the thin films 108 (comprising $SiO_2$, gold black and $Si_3N_4$) can be etched to expose a portion 112 of the amorphous silicon layer 109 using photolithographic/etch techniques, such as XeF12, Cl or H2 etching or another appropriate technique known to those skilled in the art. The amorphous silicon in the cavity is etched and the cavity is created, the device is fully fabricated. Such portion 112 of the layer 109 can serve as the amorphous silicon layer (e.g. layer 3 described above) upon which carbon nanotubes, nanoparticles, and/or thin films, such as those described above in FIGS. 1A-1C, can be deposited.

According to the illustrative embodiment, light detecting elements can have a suspended region 112 overlying a gap 111, above substrate material 101. The gap is created using techniques as described herein. Second substrate material 102 may be an insulator such as one listed above and may be the same insulating material as 102 or second substrate material 101 may be a semiconductor (such as, but not limited to, Si (single crystal, polycrystalline and amorphous), Ge, SiGe, SiC, Diamond, GaN, GaAs, GaP, AlGaAs, InP, GaP, CdTe, AlN, InAs, AlxInl-xP, and other III-V and II-VI semiconductors) or a conductor (such as, but not limited to, Al, Cu, W, Al(<1% Cu), Co, Ti, Ta, W, Ni, Mo, Pd, Pt, TiW, Ru, CoSix, WSi2, TiSix, TaN, TiN, TiAlN, RuN, RuO, PtSi, Pd2Si, MoSi2, NiSix). The substrate material systems can be chosen for circuitry technologies considerations. The suspended region of nanostructure 112 defines the electromagnetic sensing region of the detecting element. The light detection from the detecting element is controlled by driving circuitry depicted in FIG. 4 below.

FIGS. 3A-F depict a vanadium oxide microbolometer structure at various stages in a method of manufacturing according to one or more aspects of the disclosure. The FIGS. 3A-F can be similar to those described above with respect to FIGS. 2A-F, with the substitution of vanadium oxide in for amorphous silicon.

FIG. 4 depicts a CMOS readout circuit according to one or more aspects of the disclosure. As shown in FIG. 4, there is a standard half circuit 208-202 operatively connected to a unit cell circuit 201 which includes the IR detector. A dynamic discharging output stage circuit 206-210 is operatively connected to the unit cell circuit. The capacitance of the detector changes and requires a higher value capacitor in [201], and the detector bias is increased to 2-4 volts, and the preamplication in MP requires a higher gain. In the example of FIG. 1A, the capacitor 201 is a 50 microfarad and the premplication in MP is over 500. In the example of FIG. 1B, 200 microfarad with gain over 500. In the example of FIG. 1C, 900 microfarads and 1000 gain.

FIG. 5 depicts a process flow of depositing nanotubes, nanoparticles, and/or a thin film upon an amorphous silicon microbolometer structure. As shown, the microbolometer structure includes a CMOS read-out circuit, such as the circuit described above in FIG. 4. The structure can also include a reflector 305 (comprising copper or gold, which can reflect light back up to detector), a metal stud 302 (comprising e.g., a tungsten plug that serves as a connection to CMOs circuitry), a thermal insulating leg 303 that provides thermal insulation, and a cantilevered amorphous silicon layer 304 that serves as the detection component. The layer 304 can be the exposed portion 112 of amorphous silicon described in FIG. 2 and can serve as the layer 3 upon which carbon nanotubes, nanoparticles, and/or thin films, such as those described above in FIGS. 1A-1C, can be deposited.

In fabrication of the examples of FIG. 1A-C, flow process A (including blocks 306, 307, and 308) can be used.

At block 306, using a set of carbon nanotubes both single and multiwall configurations, suspend carbon nanotubes in either aqueous or non-aqueous casting solvents. Wafer is placed on a rotating chuck and rotated at 10-500 rpm depending on thickness and CNT casting solvent solution is sprayed on wafer resulting in a film of nanotubes.

At block 307, for the random (unaligned) carbon nanotubes, deposit random nanotubes in casting solvent, shake well to disperse in solution.

At block 308, after creating the nanotube films described above, using a high voltage field coupled to the wafer aligning or partially aligning carbon nanotubes after applying a high voltage field. (50-250V). This is tunable depending on the voltage level and application duration.

In fabrication of the examples of FIGS. 1A-C, flow process B (including blocks 310, 311, and 312) can be used.

At block 310, deposit silicon nanoparticles in spray deposit −0.01 to 10% by volume. Rotate the wafer from 10-500 rpm and apply to wafer. Random CNT film will spread over the wafer surface uniformly.

At block 311, deposit silicon nanoparticles in spray deposit −0.01 to 10% by volume. Rotate the wafer from 10-500 rpm and apply to wafer. Random CNT film will spread over the wafer surface.

At block 312, after creating the nanotube films described above, using a high voltage field coupled to the wafer aligning or partially aligning the carbon nanotubes after applying a high voltage field. (50-250V). This alignment is tunable depending on the voltage level and application duration.

In fabrication of the example of FIGS. 1A-C, flow process C (including block 313, 314, 315, and 316) can be used.

At block 313, using DC Sputtering or e-beam evaporation, deposit a non-continuous thin film of either Si3N4 or SiO2 on the wafer surface. The deposition of films without features is dependent on the deposition time, where the island coalesce into a continuous film. In the case where features such as stripes are required, a molybdenum mask with the appropriate features is fabricated. The deposition is then conducted through the mask and the features are deposited on wafer.

At block 314, using either an aqueous or non-aqueous solution the nanoparticles are suspended in the casting solvent. The concentration of silicon nanoparticles in the casting solvent is 0.01 to 10% by volume. The wafer is rotated at 10-100 RPM and the nanoparticles/casting solvent is sprayed on during rotation creating a uniform dispersion of nanoparticles across the wafer.

At block 315, after creating the nanotube films described above, using a high voltage field coupled to the wafer aligning or partially aligning carbon nanotubes after applying a high voltage field. (50-250V). This is tunable depending on the voltage level and application duration.

At block 316, for the random case, deposit random nanotubes in casting solvent, shake well to disperse in solution.

Each of the flow processes A-C above continue with blocks 309, 317, and 318 in fabricating the microbolometer structure.

At block 309, to ensure attachment of the nanoparticles to the CNTs a H2 or Cl2 glow discharge etch is undertaken. In a vacuum system a circular copper coil is coupled to a RF power supply and after achieving base pressure of less the 5 microns, either H2 or Cl2 is flowed in 1-15 sccm flows. The discharge is ignited and the surface of the nanotubes are etched resulting in dangling carbon bonds which the nanoparticles will attach themselves to.

At block 317, after creating the nanotube films described above, using a high voltage field coupled to the wafer aligned or partially align carbon nanotubes after applying a high voltage field. (50-250V). This is tunable depending on the voltage level and application duration. Using either an aqueous or non-aqueous solution the nanoparticles are suspended in the casting solvent. The concentration of silicon nanoparticles in the casting solvent is 0.01 to 10% by volume. The wafer is rotated at 10-100 RPM and the nanoparticles/casting solvent is sprayed on during rotation creating a uniform dispersion of nanoparticles across the wafer.

At block 318, using either argon or H2 in N2 at 2% by volume put wafers in an oven at 50-150 degree Celsius and anneal for 1 to 60 minutes to obtain a stable nanostructure.

Upon deposition of the carbon nanotube and nanoparticle composite upon the amorphous silicon layer 304, the microbolometer can detect incident infrared radiation 301.

FIG. 6 depicts a process flow of depositing nanotubes, nanoparticles, and/or a thin film upon a vanadium oxide microbolometer structure. As shown, the vanadium oxide microbolometer structure can include a layer 302 of SiO2 and and a layer of vanadium oxide atop of the SiO2, thereby forming the cantilevered VOx detection member. The structure can also include an isolation bridge 303 (e.g., nickel to provide thermal isolation), copper or aluminum top terminal layers (e.g., Y metal 305, X metal 304, E 306, B 307) and CMOS readout circuit 101, such as circuitry described above in FIG. 4.

In fabrication of the example of FIGS. 1A-C, flow process A (including blocks 310-314, 315, and 330) can be used.

At block 310, using a set of carbon nanotubes both single and multiwall configurations. Suspend nanotubes carbon nanotubes in either aqueous or non-aqueous casting solvent. Wafer is placed on a rotating chuck and rotated at 10-500 rpm depending on thickness and CNT casting solvent is sprayed on wafer resulting in a film of nanotubes.

At block 311, after creating the nanotube films described above, using a high voltage field coupled to the wafer aligned carbon nanotubes after applying a high voltage field. (50-250V). The degree of alignment is tunable depending on the voltage level and application duration.

At block 312, After the high voltage alignment, use a nitrogen environment for one hour to drive off moisture that might have coated the nanotubes during the high voltage alignment.

At block 313, for the random case, deposit random nanotubes in casting solvent, shake well to disperse in solution.

At block 314, to insure attachment of the nanoparticles to the CNTs a H2 or Cl2 glow discharge etch is undertaken. In a vacuum system a circular copper coil is coupled to a RF power supply and after achieving base pressure of less the 5 microns, either H2 or Cl2 is flowed in 1-15 sccm flows. The discharge is ignited and the surface of the nanotubes are etched resulting in dangling carbon bond which the nanoparticles will attach themselves to.

At block 315, using either an aqueous or non-aqueous solution the nanoparticles are suspended in the casting solvent. The concentration of silicon nanoparticles in the casting solvent is 0.01 to 10% by volume. The wafer is rotated at 10-100 RPM and the nanoparticles/casting solvent is sprayed on during rotation creating a uniform dispersion of nanoparticles across the wafer.

At block 330, using either argon or H2 in N2 at 2% by volume put wafers in a oven at 50-150 degree Celsius and anneal for 1 to 60 minutes to obtain a stable nanostructure.

In fabrication of the example of FIGS. 1A-C, flow process B (including blocks 316-321, as well as blocks 315 and 330 of process A) can be used.

At block 316, using a tube furnace at 150 C 10-50 sccm flow Argon, process the wafers for one hour to drive off h20 absorbed from previous processing.

At block 317, using either an aqueous or non-aqueous solution the nanoparticles are suspended in the casting solvent. The concentration of silicon nanoparticles in the casting solvent is 0.01 to 10% by volume. The wafer is rotated at 10-100 RPM and the nanoparticles/casting solvent is sprayed on during rotation creating a uniform dispersion of nanoparticles across the wafer.

At block 318, after creating the nanotube films described above, using a high voltage field coupled to the wafer aligned or partially align carbon nanotubes after applying a high voltage field. (50-250V). The degree of alignment is tunable depending on the voltage level and application duration At block 319, for random tubes utilize an adhesion promoter to insure stickiness to the underlying material. The Compound is HMDS (hexamethyldisalizane) in Freon vapor is used here.

At block 320, for the random case, deposit random nanotubes in casting solvent, shake well to disperse in solution.

At block 321, to insure attachment of the nanoparticles to the CNTs a H2 or Cl2 glow discharge etch is undertaken. In a vacuum system a circular copper coil is coupled to a RF power supply and after achieving base pressure of less the 5 microns, either H2 or Cl2 is flowed in 1-15 sccm flows. The discharge is ignited and the surface of the nanotubes are etched resulting in dangling carbon bond which the nanoparticles will attach themselves to.

The process then continues with blocks 315 and 330, as described above.

In fabrication of the example of FIGS. 1A-C, flow process C (including block 322-327) can be used.

At block 322, using DC Sputtering or e-beam evaporation deposit on non-continuous thin films of Si3N4 or SiO2 on the wafer surface. The deposition of films without features is dependent on the deposition time, where the island coalesce into a continuous film. In the case where features such as stripes are required a molybdenum mask with the appropriate features is fabricated. The deposition is then conducted through the mask and the features are deposited on wafer At block 323, using either an aqueous or non-aqueous solution the nanoparticles are suspended in the casting solvent. The concentration of silicon nanoparticles in the casting solvent is 0.01 to 10% by volume. The wafer is rotated at 10-100 RPM and the nanoparticles/casting solvent is sprayed on during rotation creating a uniform dispersion of nanoparticles across the wafer.

At block 324, after creating the nanotube films described above, using a high voltage field coupled to the wafer aligned or partially align carbon nanotubes after applying a high voltage field. (50-250V). The degree of alignment is tunable depending on the voltage level and application duration.

At block 325, using a set of carbon nanotubes both single and multiwall configurations. Suspend nanotubes carbon nanotubes in either aqueous or non-aqueous casting solvent. Wafer is placed on a rotating chuck and rotated at 10-500 rpm depending on thickness and CNT casting solvent is sprayed on wafer resulting in a film of nanotubes.

At block 326, to insure attachment of the nanoparticles to the CNTs a H2 or Cl2 glow discharge etch is undertaken. In a vacuum system a circular copper coil is coupled to a RF power supply and after achieving base pressure of less the 5 microns, either H2 or Cl2 is flowed in 1-15 sccm flows. The discharge is ignited and the surface of the nanotubes are etched resulting in dangling carbon bond which the nanoparticles will attach themselves to.

At block 327, using either argon or H2 in N2 at 2% by volume put wafers in a oven at 50-150 degree Celsius and anneal for 1 to 60 minutes to obtain a stable nanostructure.

Upon deposition of the carbon nanotube and nanoparticle composite upon the VOx layer 304, the microbolometer can detect incident infrared radiation 301.

Figure 7:
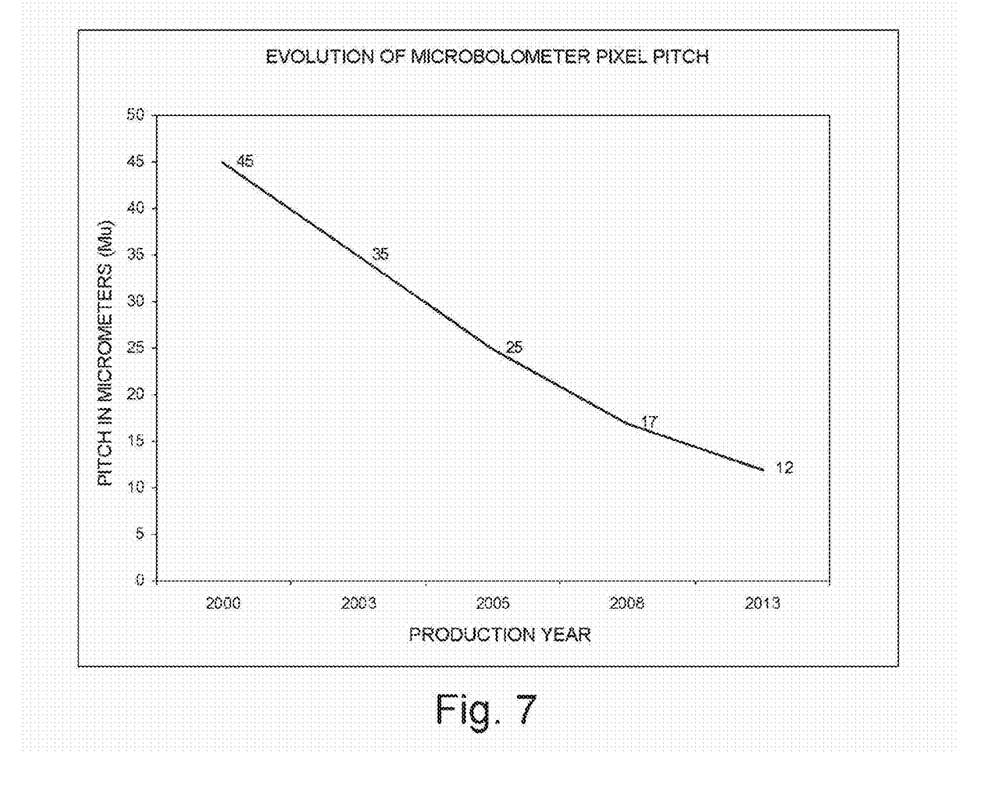
FIG. 7 is a chart depicting the downward evolution of microbolometer cell size.

FIG. 7 is a chart depicting the downward evolution of microbolometer cell size. The microbolometer examples above are all compatible with the downward evolution of microbolometer cell size as described in FIG. 7.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. Accordingly, this description is meant to be taken only by way of example, and not to otherwise limit the scope of this invention.

What is claimed is:

1. An Infrared (IR) detector comprising:
    a substrate;
    a film of vanadium oxide or amorphous silicon suspended over the substrate and between electrical contacts;
    a film of silicon CNT nanocomposite on top of the thin film of vanadium oxide or amorphous silicon, the thin film of CNT nanocomposite comprising nanoparticles dispersed within aligned carbon nanotubes at approximately 0.05% to 10% by volume;
    first and second conductive contacts in electrical communication with the thin film of vanadium oxide or amorphous silicon of Silicon-CNT or Si-CNT nanocomposites;
    a non-continuous film disposed on top of the substrate comprising at least one of silicon nitride or amorphous silicon.

2. The IR detector of claim 1 wherein the a film of silicon CNT nanocomposite is composed of single wall or multiwall carbon nanotubes having diameters corresponding to a tuned IR response wavelength.

3. The IR detector of claim 1 wherein the film of silicon CNT nanocomposite is composed of multi wall carbon nanotubes having diameters corresponding to a tuned IR response wavelength.

4. The IR detector of claim 1 wherein the a film of silicon CNT nanocomposite is composed of single wall carbon nanotubes and multi wall carbon nanotubes having diameters corresponding to a tuned IR responsive wavelength.

5. The IR detector of claim 1 wherein the detector exhibits an NEDT of <1 mk and a noise floor of 0.05 mV RMS.

* * * * *